(12) United States Patent
Srinivasan et al.

(10) Patent No.: US 7,224,571 B2
(45) Date of Patent: May 29, 2007

(54) FORMING A SUBSTRATE CORE WITH EMBEDDED CAPACITOR AND STRUCTURES FORMED THEREBY

(75) Inventors: Sriram Srinivasan, Chander, AZ (US); John S. Guzek, Chandler, AZ (US); Cengiz A. Palanduz, Chandler, AZ (US); Victor Prokofiev, Phoenix, AZ (US); Joel A. Auernheimer, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/218,357

(22) Filed: Sep. 2, 2005

(65) Prior Publication Data

US 2006/0146476 A1    Jul. 6, 2006

Related U.S. Application Data

(62) Division of application No. 11/027,386, filed on Dec. 30, 2004.

(51) Int. Cl.
*H01G 4/228* (2006.01)
(52) U.S. Cl. .................. 361/306.3; 361/311; 361/313; 361/306.1; 361/321.1; 361/321.4
(58) Field of Classification Search ............... 361/302, 361/311–313, 306.1–3, 321.1–4, 301.1–4
See application file for complete search history.

(56) References Cited

U.S. PATENT DOCUMENTS

| | | | |
|---|---|---|---|
| 4,890,192 A * | 12/1989 | Smith | ......................... 361/313 |
| 5,745,334 A | 4/1998 | Hoffarth et al. | |
| 5,800,575 A | 9/1998 | Lucas | |
| 6,236,102 B1 * | 5/2001 | Kim et al. | ................... 257/532 |
| 6,339,527 B1 * | 1/2002 | Farooq et al. | .............. 361/305 |
| 6,433,993 B1 | 8/2002 | Hunt et al. | |
| 6,448,628 B2 * | 9/2002 | Chern et al. | ................ 257/532 |
| 6,459,117 B1 * | 10/2002 | Liou | ........................... 257/306 |
| 6,477,036 B2 * | 11/2002 | Kitagawa et al. | ........... 361/312 |
| 6,605,515 B2 * | 8/2003 | Kitagawa et al. | ........... 438/393 |
| 6,739,027 B1 | 5/2004 | Lauffer et al. | |
| 6,749,928 B2 | 6/2004 | Takaya et al. | |
| 6,754,952 B2 | 6/2004 | Takano et al. | |
| 6,897,508 B2 * | 5/2005 | Sneh | .......................... 257/301 |
| 6,910,266 B2 | 6/2005 | Lee et al. | |
| 6,928,726 B2 | 8/2005 | Zollo et al. | |
| 7,027,289 B2 * | 4/2006 | He et al. | ..................... 257/532 |
| 2004/0196620 A1 * | 10/2004 | Knudsen et al. | ............ 361/311 |

OTHER PUBLICATIONS

Pending U.S. Appl. No. 11/027,386, filed Dec. 30, 2004, inventor: Srinivasan.

* cited by examiner

*Primary Examiner*—Nguyen T. Ha
(74) *Attorney, Agent, or Firm*—Kathy J. Ortiz

(57) ABSTRACT

Methods of forming a microelectronic structure are described. Embodiments of those methods include forming a substrate core by attaching a first dielectric layer to a second conductive layer of a thin film capacitor, and attaching a second dielectric layer to a first conductive layer of the thin film capacitor.

15 Claims, 10 Drawing Sheets

FORMING A SUBSTRATE CORE WITH EMBEDDED CAPACITOR AND STRUCTURES FORMED THEREBY

CROSS REFERENCE TO RELATED APPLICATION

This application is a divisional of U.S. patent application Ser. No. 11/027,386 filed Dec. 30, 2004.

BACKGROUND OF THE INVENTION

A microelectronic device may include many integrated circuits (IC's) that may be integrated within a substrate.

A power source such as a voltage regulator may provide power signals to an IC substrate and/or die package system during operation. When the IC die transitions from a relatively idle state to a relatively active state, the resulting demand on the power source may cause the power signals to exhibit a "first droop". The magnitude of the first droop may be decreased by adding capacitance to the packaging system.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
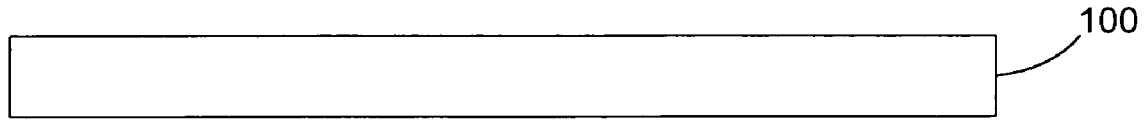
FIGS. 1a-1h represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a substrate core structure, are described. Those methods may comprise forming a substrate core by attaching a first dielectric layer to a second conductive layer of a thin film capacitor, and attaching a second dielectric layer to a first conductive layer of the thin film capacitor.

FIGS. 1a-1h illustrate an embodiment of a method of forming a microelectronic structure, such as a substrate core structure, for example. A substrate core structure may comprise a central structure upon which other layers, such as, but not limited, to build-up layers, as are well known in the art, may be disposed upon. FIG. 1a illustrates a first conductive layer 100. In one embodiment, the first conductive layer 100 may comprise a conductive material, such as but not limited to copper, aluminum, gold, silver and/or nickel and combinations thereof. In one embodiment, the first conductive layer 100 may comprise a thickness from about 5 to about 50 microns.

Figure 1B:
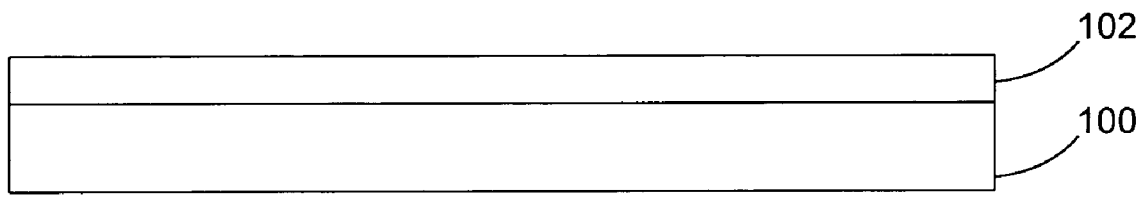

In one embodiment, a capacitor dielectric layer 102 may be formed on the first conductive layer 100 (FIG. 1b). In one embodiment, the capacitor dielectric layer 102 may comprise any dielectric layer, such as silicon dioxide and/or silicon nitride for example, that may be used to form a thin film capacitor, as is well known in the art. In another embodiment, the capacitor dielectric layer 102 may comprise at least one of hafnium oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate and combinations thereof. In one embodiment, the capacitor dielectric layer 102 may comprise a dielectric constant greater than about 8, and may comprise a high k capacitor dielectric layer 102. In one embodiment, the thickness of the capacitor dielectric layer 102 may range from about 100 to about 500 nanometers. In one embodiment, the capacitor dielectric layer 102 may be formed by a deposition process, such as but not limited to physical vapor deposition, (PVD), chemical solution deposition (CSD), and metal organic vapor deposition (MPCVD), for example.

Figure 1C:
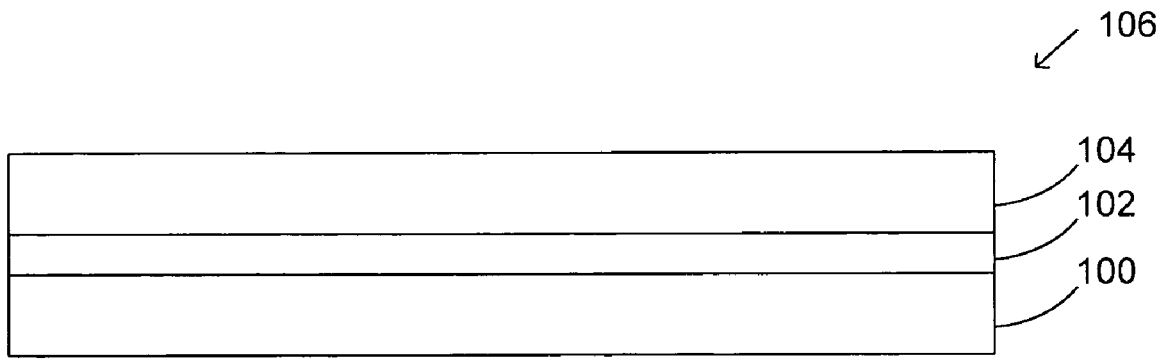

A second conductive layer 104 may be formed on the capacitor dielectric layer 102, to form a thin film capacitor 106 (FIG. 1c). In one embodiment, the second conductive layer 104 may comprise a conductive material, such as but not limited to copper, aluminum, gold, silver and/or nickel and combinations thereof. In one embodiment, the second conductive layer 104 may comprise a thickness from about 5 to about 50 microns. In one embodiment, the thin film capacitor 106 may comprise a capacitance from about 2 to about 4 micro Farads per centimeter squared.

Figure 1D:
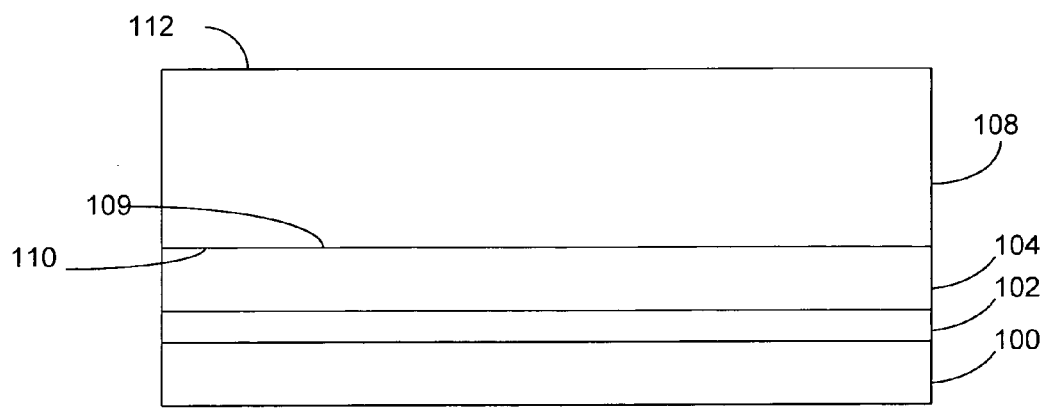
Figure 1E:
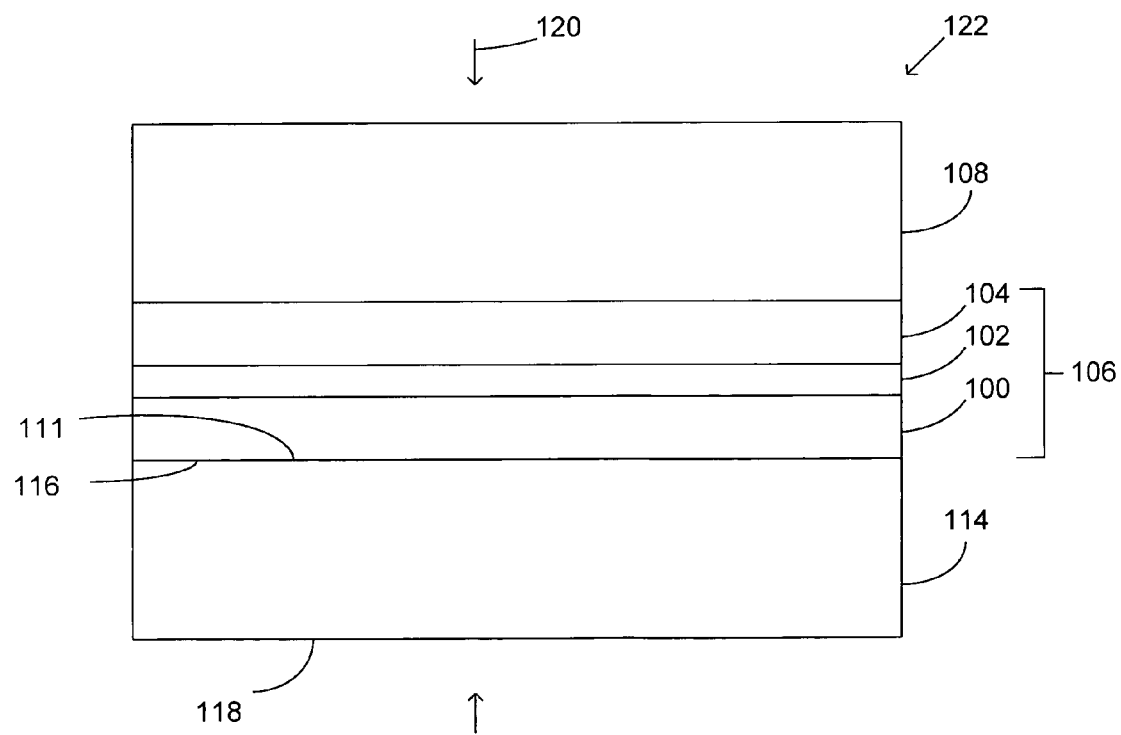

A first side 110 of a first dielectric layer 108 may be attached to the second conductive layer 104 (FIG. 1d). In one embodiment, the first dielectric layer 108 may be attached to an outer surface 109 of the second conductive layer 104. The first dielectric layer 108 may further comprise a second side 112. In one embodiment, the first dielectric layer 108 may comprise a prepreg layer, such as an epoxy resin layer, as is well known in the art, disposed on a core material (similar to the dielectric layer 208 of FIG. 2d, for example). In one embodiment, the first dielectric layer 108 may comprise an organic material. In one embodiment, the first dielectric layer 108 may comprise conductive pads disposed on the first side 110 and on the second side 112 (similar to the dielectric layer 208 of FIG. 2d, for example).

In one embodiment, a first side 116 of a second dielectric layer 114, similar to the first dielectric layer 108, may be attached on the first conductive layer 100 of the thin film capacitor 106, to form a substrate core structure 122 (FIG. 1e).). In one embodiment, the second dielectric layer 114 may be attached to an outer surface 111 of the first conductive layer 100. In one embodiment, the first dielectric layer 108, the thin film capacitor 106, and the second dielectric layer 114 may be pressed 120 together utilizing a laminating process, for example, as are well known in the art. In one embodiment, the substrate core structure 122 may comprise a microelectronic package substrate core, as is well known in the art.

Figure 1F:
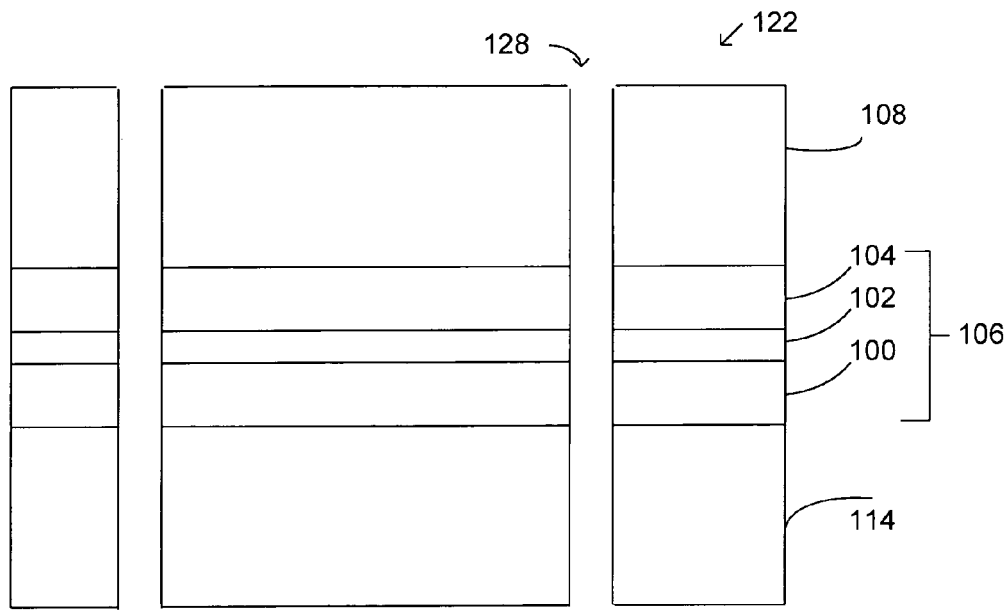
Figure 1G:
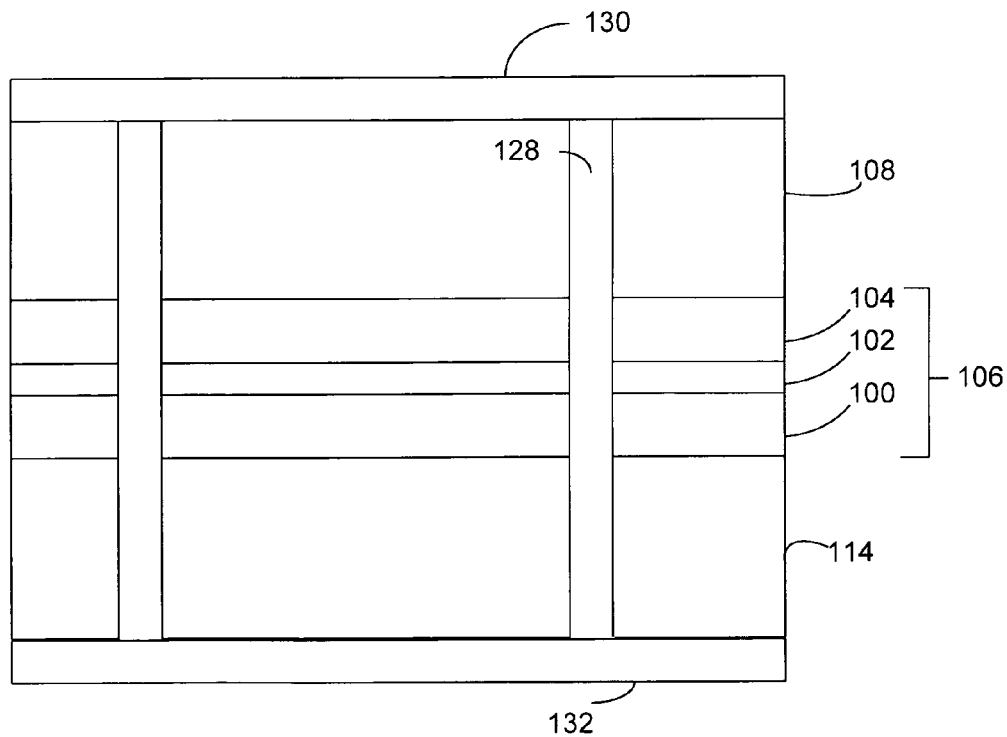

At least one opening 128 may be formed through the substrate core structure 122 (FIG. 1f). In one embodiment, the at least one opening 128 may comprise a via as is well known in the art, and may be formed by laser drilling and/or chemical etching, by illustration and not limitation. The at least one opening 128 may comprise a plated through hole (PTH) in some embodiments, and may be filled with conductive material (not shown). The at least one opening 128 may be electrically connected to conductive traces 130, 132, that may be disposed on the first and second dielectric layers 108, 114 respectively (FIG. 1g).

Figure 1H:
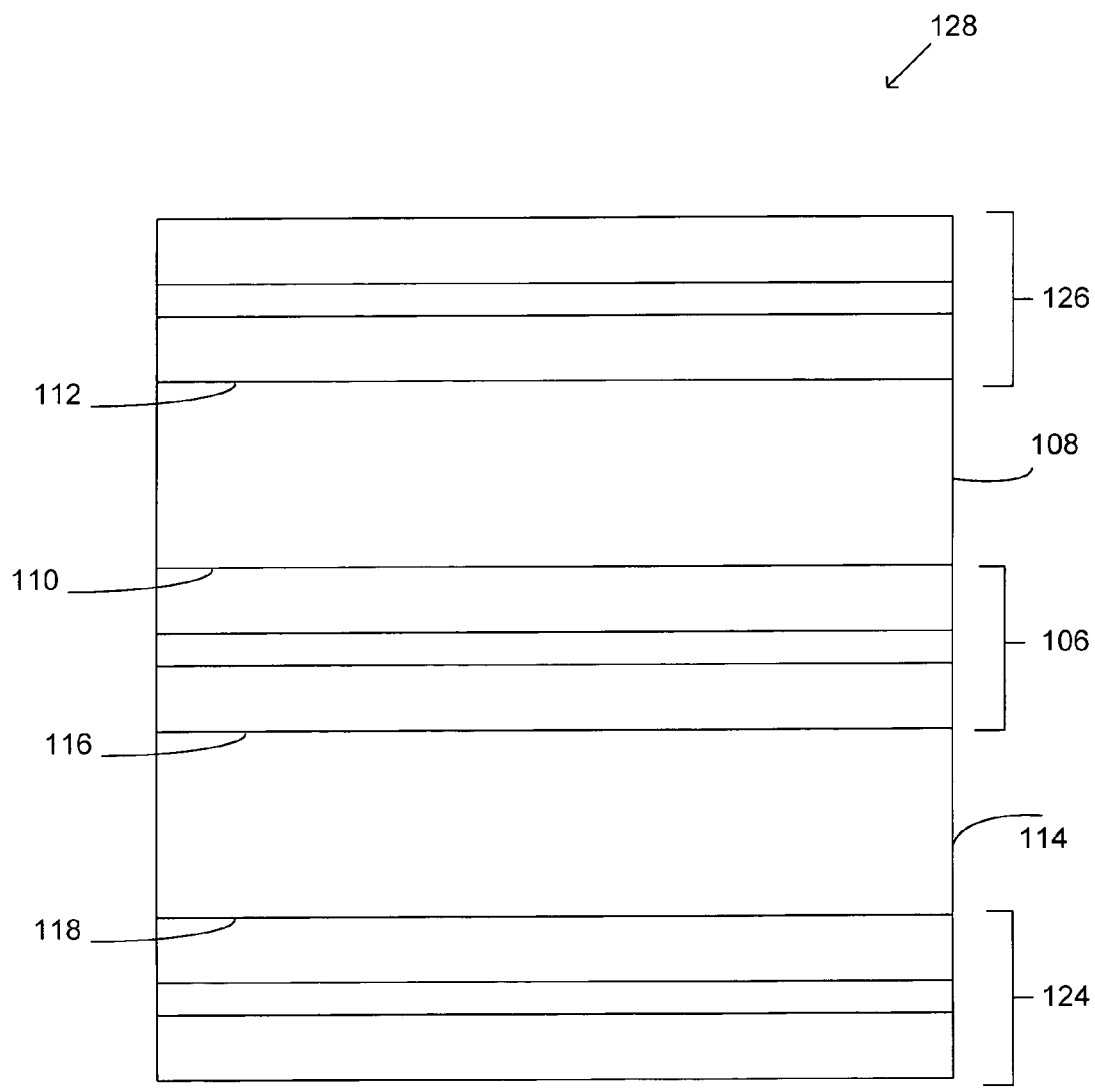

It will be understood by those skilled in the art that in some embodiments, the substrate core structure may comprise repeating layers of dielectric and thin film capacitors. For example, in one embodiment, a substrate core structure 128 may comprise a first thin film capacitor 106 disposed between a first side 110 of a first dielectric layer 108 and a first side 116 of a second dielectric layer 114 (FIG. 1h). A second thin film capacitor 124 may be disposed on a second side 118 of the second dielectric layer 114 and a third thin film capacitor 126 may be disposed on a second side 112 of the first dielectric layer 108.

Thus, a substrate core structure may be formed that comprises at least one embedded thin film capacitor. In one embodiment, embedded thin film capacitor(s) within the substrate core may reduce design cost since redesign of a substrate interposer and/or build up layers to allow for additional capacitors may not be necessary since package capacitive requirements may be met with the core embedded capacitors.

Figure 2A:
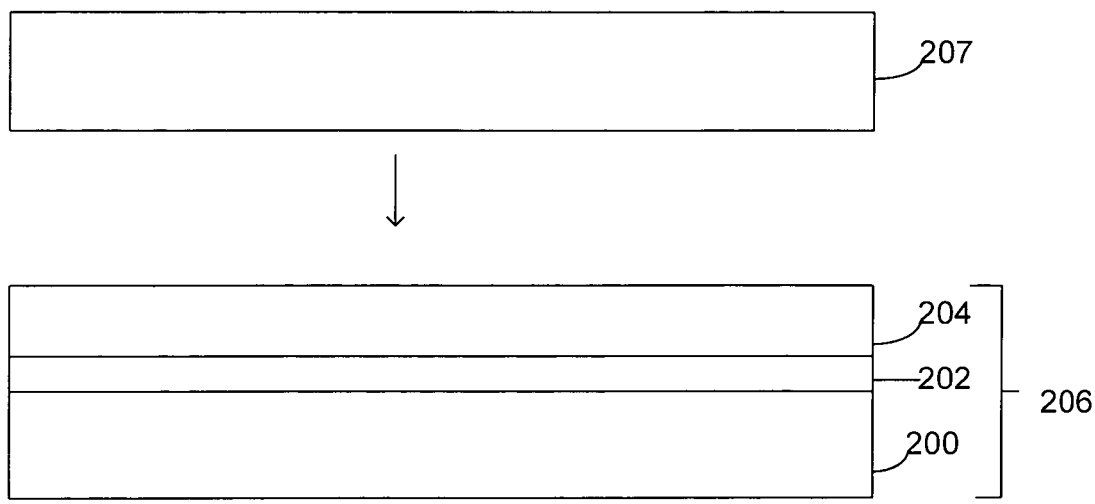
FIGS. 2a-2f represent methods of forming structures according to another embodiment of the present invention.

FIGS. 2a-2f depict another embodiment of a method of forming a microelectronic structure, such as a substrate core structure, for example. FIG. 2a illustrates a first thin film capacitor 206. In one embodiment, the first thin film capacitor 206 may comprise a first capacitor dielectric layer 202 disposed between a first conductive layer 200 and a second conductive layer 204 (similar to the thin film capacitor 106 of FIG. 1e, for example). In one embodiment, the first conductive layer 200 and the second conductive layer 204 may comprise a thickness from about 5 to about 50 microns. In one embodiment, the capacitor dielectric layer 202 may comprise a dielectric constant greater than about 8, and may comprise a high k capacitor dielectric layer 202. In one embodiment, the thickness of the capacitor dielectric layer 202 may range from about 100 to about 500 nanometers.

Figure 2B:
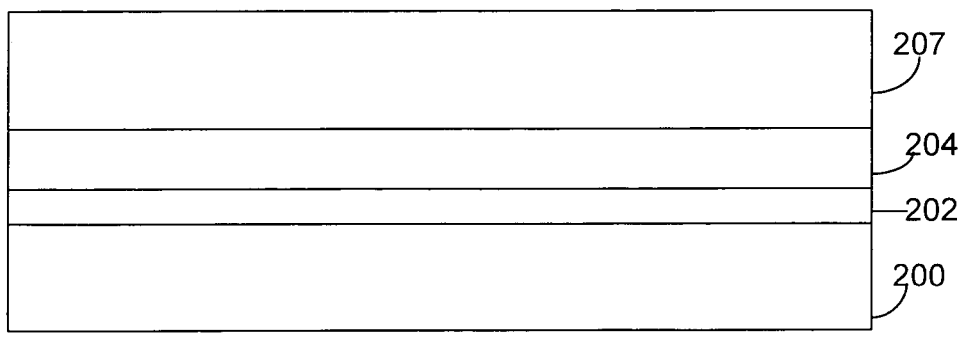
Figure 2C:
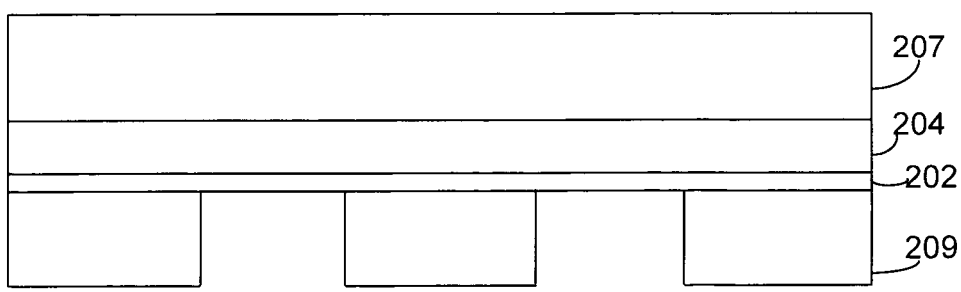

In one embodiment, a carrier panel 207 may be attached to the first thin film capacitor 206 to facilitate handling of the first thin film capacitor 206, as is well known in the art (FIG. 2b). In one embodiment, the first conductive layer 200 may be patterned to form a plurality of conductive pads 209, utilizing patterning techniques well known in the art, such as but not limited to wet and/or dry etching methods (FIG. 2c).

Figure 2D:
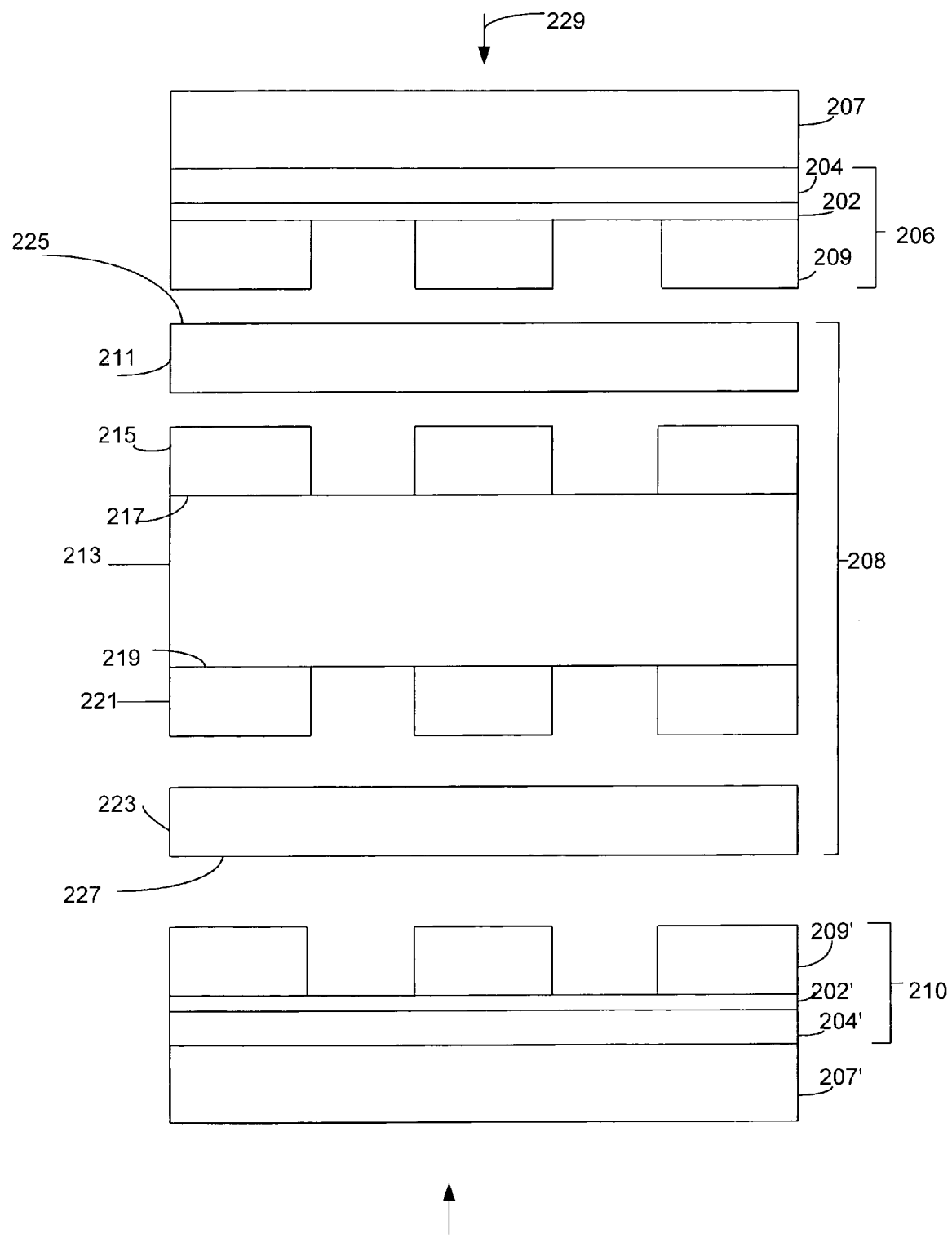

A dielectric layer 208 may be provided (FIG. 2d). In one embodiment, the dielectric layer 208 may be a layered structure that may comprise a core material 213 disposed between a first prepreg layer 211 and a second prepreg layer 223. In one embodiment, the first and second prepreg layer 211, 223 may comprise an epoxy resin, and the core material 213 may comprise an organic material. In one embodiment, the core material 213 may further comprise a first plurality of core pads 215 disposed on a first side 217 of the core material 213, and a second plurality of core pads 221 disposed on a second side 219 of the core material 213. In one embodiment, the core pads 221 may comprise a conductive material, and may provide added design flexibility depending upon the particular application, as is well known in the art.

Figure 2E:
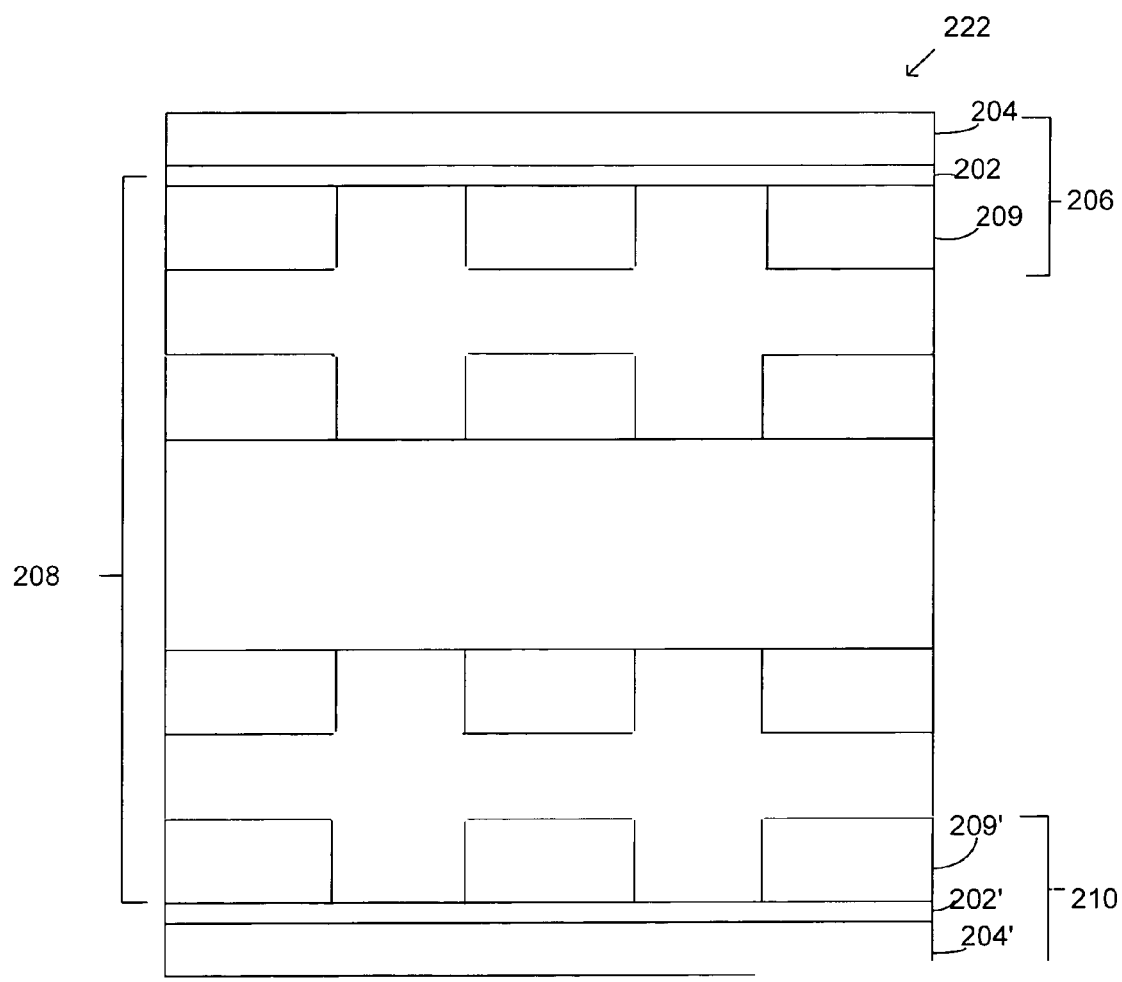

In one embodiment, a second thin film capacitor 210 may be provided that may comprise a second plurality of conductive pads 209', a capacitor dielectric layer 202' disposed on the second plurality of conductive pads 209' and a second conductive layer 204' disposed on the capacitor dielectric layer 202' (FIG. 2d). A carrier panel 207' may be attached to the second conductive layer 204'. In one embodiment, the first plurality of conductive pads 209 of the first thin film capacitor 206 may be attached to a first side 225 of the dielectric layer 208, and the second plurality of conductive pads 209' of the second thin film capacitor 210 may be attached to a second side 227 of the dielectric layer 208 to form a substrate core structure 222 (FIG. 2e).

Figure 2F:
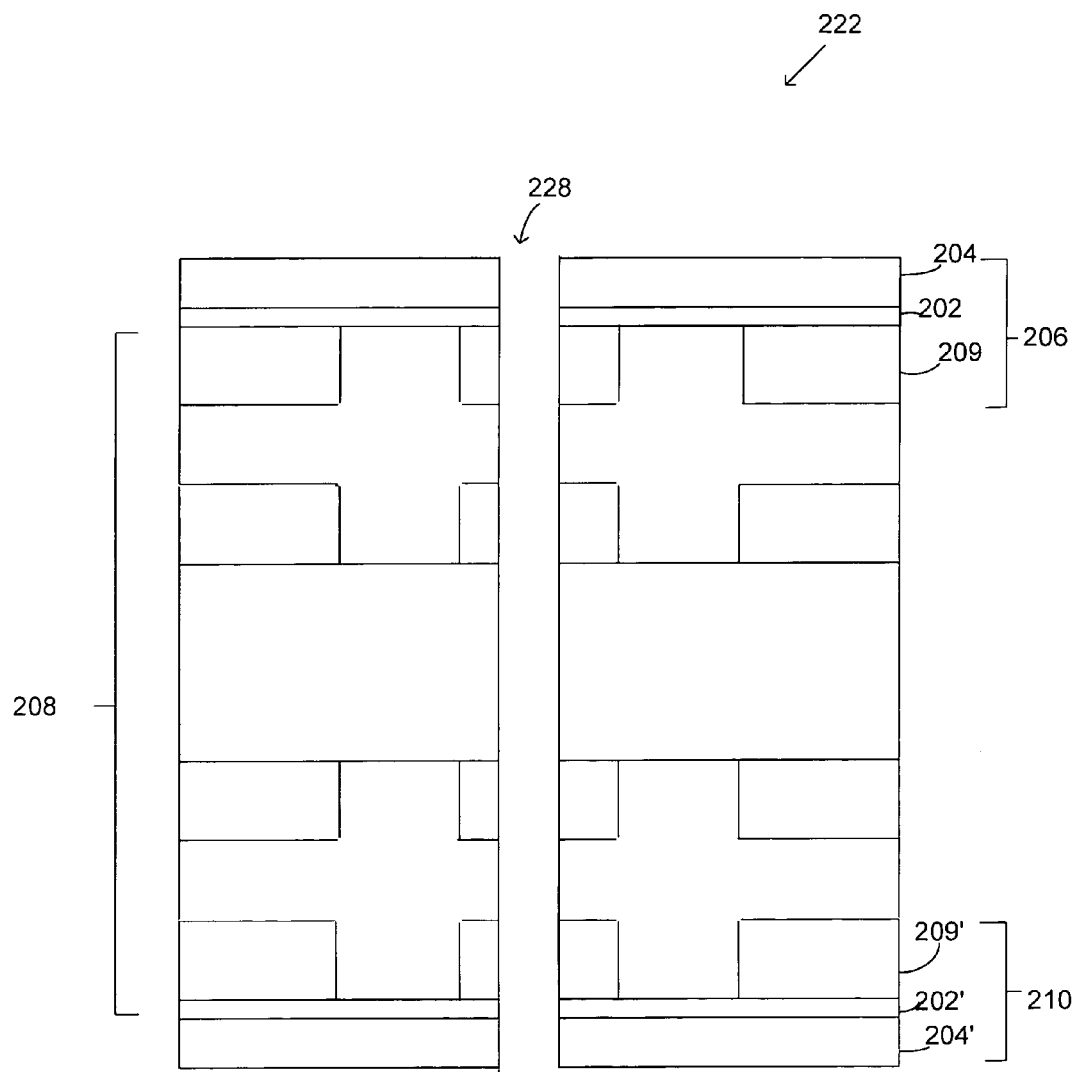

In one embodiment, the first thin film capacitor 206, the dielectric layer 208, and the second thin film capacitor 210 may be attached by a laminating process 229, as is well known in the art (FIG. 2d). In one embodiment, at least one opening 228 may be formed through the substrate core structure 222 (FIG. 2f). In one embodiment, the at least one opening 228 may comprise a via as is well known in the art. The at least one opening 228 may comprise a plated through hole (PTH) in some embodiments, and may be filled with conductive material (not shown). The at least one opening 228 may be electrically connected to the second conductive layers 204, 204'.

Thus, a substrate core structure 222 may be formed that comprises embedded thin film capacitors. In one embodiment, embedding thin film capacitors within the substrate core 222 may reduce design costs since package capacitive requirements may be met with the core embedded capacitors.

Figure 3A:
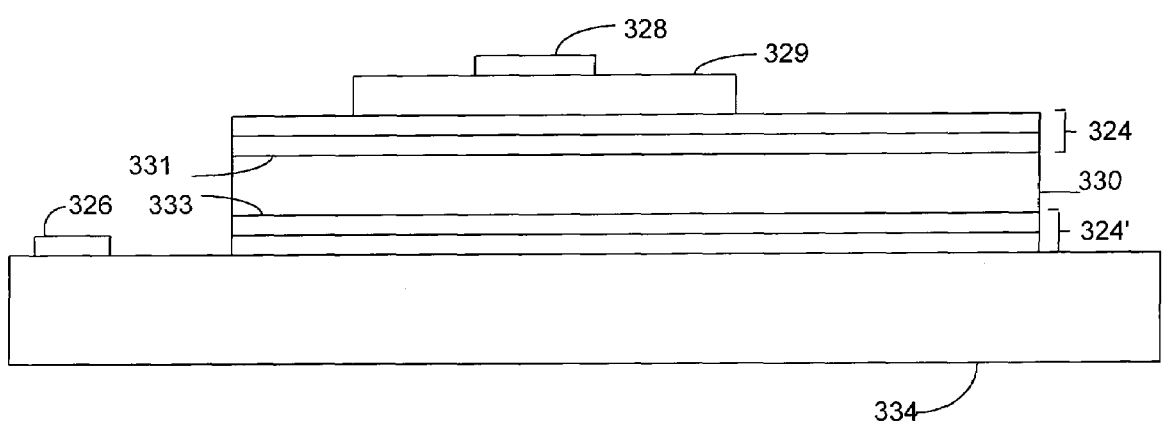
FIGS. 3a-3b represent a system according to another embodiment of the present invention.

FIG. 3a depicts a substrate core structure 330, similar to the substrate core structure 222 of FIG. 2f, for example. Build-up layers 324, 324', as are well known in the art, may be disposed on a first side 331 and a second side 333 of the substrate core structure 330 respectively. The substrate core structure 330 may be disposed on a substrate 334, that in one embodiment may comprise a printed circuit board (PCB), for example. A memory die 326 may be disposed on the PCB 334. An interposer 329 may be disposed on the substrate core structure 330. An IC 328 may be disposed on the interposer 329.

In one embodiment, a power source such as a voltage regulator (not shown) may provide power signals to the substrate core structure 330 during operation, as is well known in the art, and may be coupled to the various conductive structures of the substrate core structure 330, such as but not limited to the embedded capacitors, the core pads, the plated through holes (PTH) etc. In one embodiment, the power source may be coupled to the conductive layers of the substrate core by solder balls and/or pins, as are well known in the art. In one embodiment, when the IC 328 transitions from a relatively idle state to a relatively active state, there may be a demand on the power source that may cause the power signals to exhibit a "first droop", as is well known in the art. In one embodiment, the magnitude of the first droop may be decreased by the added capacitance of the embedded capacitors of the substrate core structure 330.

Figure 3B:
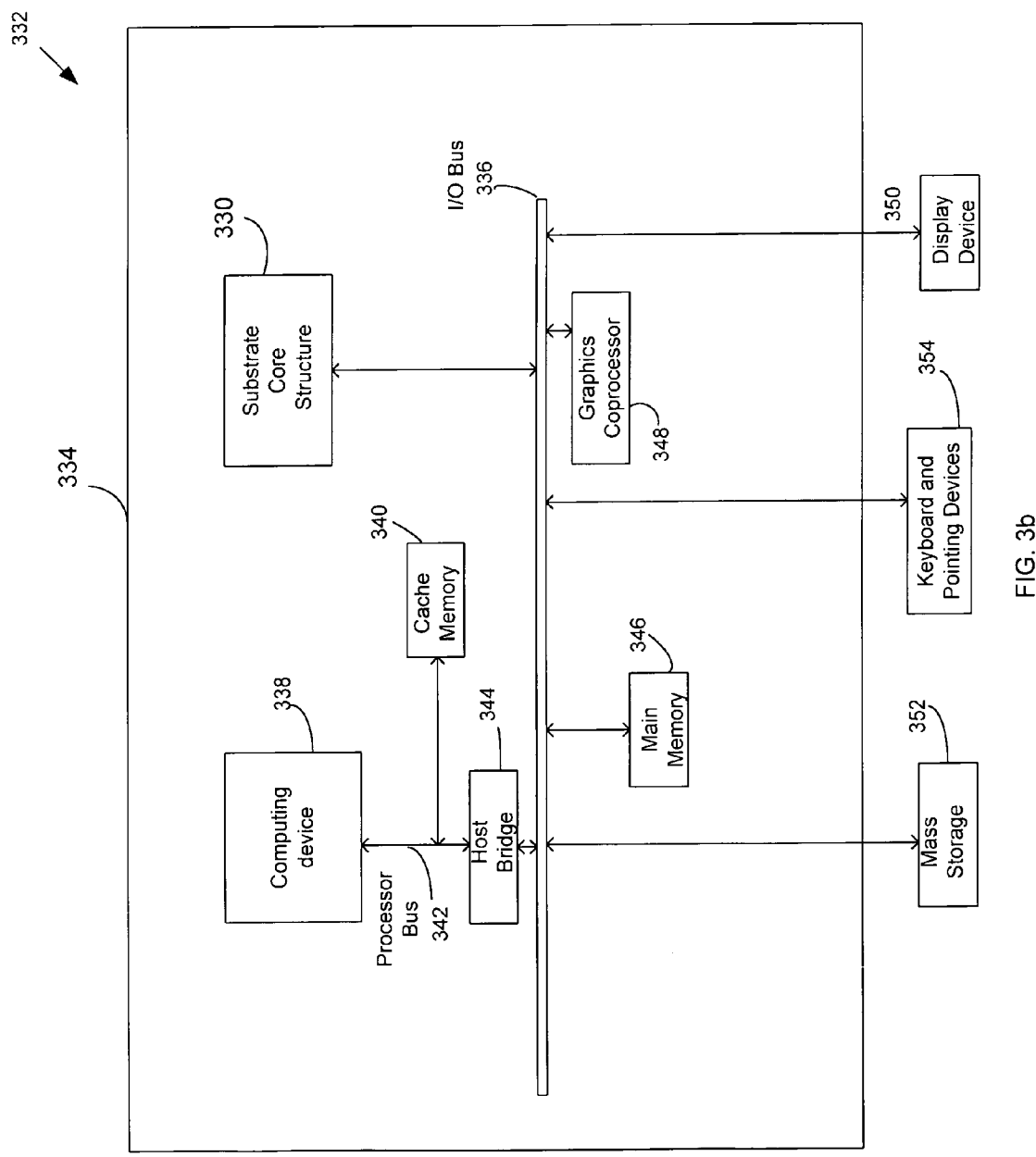

FIG. 3b is a diagram illustrating an exemplary system 332 capable of being operated with methods for fabricating a microelectronic structure, such as the substrate core structure 330 of FIG. 3a for example. It will be understood that the present embodiment is but one of many possible systems in which the substrate core structures of the present invention may be used.

In the system 332, the substrate core structure 330 may be communicatively coupled to a printed circuit board (PCB) 334 by way of an I/O bus 336. The communicative coupling of the substrate core structure 330 may be established by physical means, such as through the use of a package and/or a socket connection to mount the substrate core structure 330 to the PCB 334 (for example by the use of a chip package, interposer and/or a land grid array socket). The substrate core structure 330 may also be communicatively coupled to the PCB 334 through various wireless means (for example, without the use of a physical connection to the PCB), as are well known in the art.

The system 332 may include a computing device 338, such as a processor, and a cache memory 340 communicatively coupled to each other through a processor bus 342. The processor bus 342 and the I/O bus 336 may be bridged by a host bridge 344. Communicatively coupled to the I/O bus 336 and also to the substrate core structure 330 may be a main memory 346. Examples of the main memory 346 may include, but are not limited to, static random access memory (SRAM) and/or dynamic random access memory (DRAM), and/or some other state preserving mediums. The system 332 may also include a graphics coprocessor 348, however incorporation of the graphics coprocessor 348 into the system 332 is not necessary to the operation of the system 332. Coupled to the I/O bus 336 may also, for example, be a display device 350, a mass storage device 352, and keyboard and pointing devices 354.

These elements perform their conventional functions well known in the art. In particular, mass storage 352 may be used to provide long-term storage for the executable instructions for a method for forming substrate core structures in accordance with embodiments of the present invention, whereas main memory 346 may be used to store on a shorter term basis the executable instructions of a method for forming substrate core structures in accordance with embodiments of the present invention during execution by computing device 338. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 346 may supply the computing device 338 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as substrate core structures, are well known in the art. Therefore, the Figures provided herein illustrate only portions of an exemplary microelectronic structure that pertains to the practice of the present invention. Thus the present invention is not limited to the structures described herein.

What is claimed is:

1. A structure comprising:
    a substrate core comprising:
        a first side of a first dielectric layer disposed on a first side of a core material;
        a first side of a second dielectric layer disposed on a second side of the core material;
        a first conductive layer of a first thin film capacitor disposed on a second side of the first dielectric layer; and
        a first conductive layer of a second thin film capacitor disposed on a second side of the second dielectric layer.

2. The structure of claim 1 wherein the first thin film capacitor comprises a capacitor dielectric layer disposed between the first conductive layer and a second conductive layer.

3. The structure of claim 2 wherein the capacitor dielectric layer comprises a thickness between about 100 and about 500 nanometers, and wherein the first and second conductive layers comprise a thickness between about 5 to about 50 microns.

4. The structure of claim 2 wherein the capacitor dielectric layer comprises a dielectric constant greater than about 8.

5. The structure of claim 2 wherein the capacitor dielectric layer comprises a material selected from the group consisting of hafnium oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate.

6. The structure of claim 1 wherein the first dielectric layer and the second dielectric layer comprise a first prepreg layer and a second prepreg layer disposed on the core material, wherein the core material further comprises a first plurality of core pads disposed on the first side of the core material, and a second plurality of core pads disposed on the second side of the core material.

7. The structure of claim 6 wherein the core material comprises an organic core.

8. The structure of claim 1 further comprising at least one opening disposed through the substrate core.

9. The structure of claim 1 wherein the first and the second thin film capacitor comprise a capacitance between about 2 to about 4 micro Farads per centimeter squared.

10. A system comprising:
    a substrate core comprising:
        a first side of a first dielectric layer disposed on a first side of a core material;
        a first side of a second dielectric layer disposed on a second side of the core material;
        a first conductive layer of a first thin film capacitor disposed on a second side of the first dielectric layer; and
        a first conductive layer of a second thin film capacitor disposed on a second side of the second dielectric layer;
    a bus communicatively coupled to the substrate core; and
    a DRAM communicatively coupled to the bus.

11. The system of claim 10 wherein the second thin film capacitor comprises a capacitor dielectric layer disposed between the first conductive layer and a second conductive layer.

12. The system of claim 11 wherein the capacitor dielectric layer comprises a dielectric constant greater than about 8.

13. The system of claim 12 wherein the capacitor dielectric layer comprises a material selected from the group consisting of hafnium oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate.

14. A substrate core comprising:
a first side of a first dielectric layer disposed on a first conductive layer of a first thin film capacitor; and
a first side of a second dielectric layer disposed on a second conductive layer of the first thin film capacitor, wherein the first and the second dielectric layers comprise a prepreg layer disposed on a core material, wherein the core material comprises a first plurality of core pads disposed on a first side of the core material, and a second plurality of core pads disposed on a second side of the core material.

15. A substrate core comprising:
a first side of a first dielectric layer disposed on a first conductive layer of a first thin film capacitor;
a first side of a second dielectric layer disposed on a second conductive layer of the first thin film capacitor, wherein the first and the second dielectric layers comprise a prepreg layer disposed on a core material, wherein the core material comprises a first plurality of core pads disposed on a first side of the core material, and a second plurality of core pads disposed on a second side of the core material; and
a second thin film capacitor disposed on a second side of the second dielectric layer and a third thin film capacitor disposed on a second side of the first dielectric layer.

* * * * *